United States Patent [19]

Machamer

[11] Patent Number: 4,638,270

[45] Date of Patent: Jan. 20, 1987

[54] RESONATOR COMPRISING A COIL FORMED OF MULTIPLE LAYER ALTERNATELY ARRANGED CONDUCTIVE TURNS

[76] Inventor: George A. Machamer, 2201 N. Hawthorne St., Melrose Park, Ill. 60164

[21] Appl. No.: 581,912

[22] Filed: Feb. 17, 1984

[51] Int. Cl.$^4$ .............................................. H03H 7/09
[52] U.S. Cl. ..................................... 333/175; 333/185; 343/722; 343/749; 336/84 R; 336/170; 336/180; 336/69; 334/41
[58] Field of Search ............... 333/219, 220, 221, 175, 333/176, 185; 334/41, 38, 40, 64, 71, 74, 75; 343/722, 749, 750, 895, 868, 867; 336/69, 84 R, 170, 180, 183, 186, 188, 189, 190, 70

[56] References Cited

U.S. PATENT DOCUMENTS

| | | | |
|---|---|---|---|
| 2,791,646 | 5/1931 | Keroes | 336/183 X |
| 3,111,638 | 11/1963 | Gostyn | 336/183 |
| 3,114,120 | 12/1963 | Heck | 336/170 X |
| 3,477,016 | 11/1969 | Papaleonnidas | 336/170 X |
| 3,560,895 | 2/1971 | Matsumoto | 333/175 |
| 3,660,790 | 5/1972 | Palazzetti | 336/69 |
| 3,702,451 | 11/1972 | Hofing | 336/70 |
| 3,766,504 | 10/1973 | Yannucci et al. | 336/70 |
| 3,899,764 | 8/1975 | Van Nice | 336/70 |
| 4,255,728 | 3/1981 | Doty, Jr. | 333/219 |
| 4,277,770 | 7/1981 | Jorendal et al. | 336/186 X |
| 4,316,169 | 2/1982 | Teranishi et al. | 336/70 |
| 4,334,228 | 6/1982 | Johns | 343/722 |
| 4,335,386 | 6/1982 | Johns | 343/722 |

FOREIGN PATENT DOCUMENTS 1252316 10/1967 Fed. Rep. of Germany ...... 336/180

OTHER PUBLICATIONS

QST Magazine, Nov. 1983, pp. 27-30.

Primary Examiner—Eugene R. LaRoche
Assistant Examiner—Benny Lee
Attorney, Agent, or Firm—Wood, Dalton, Phillips, Mason & Rowe

[57] ABSTRACT

An electric resonator includes first and second pluralities of conductors which are disposed in side-by-side relationship to form a first layer of alternating first and second conductors. Additional layers of alternating first and second conductors are disposed atop the first layer such that each conductor of one of the pluralities is horizontally and/or vertically adjacent to conductors of the other plurality. The resulting resonator reduces undesirable capacitance between various conductors thereby increasing the quality factor, or Q, of the resonator.

16 Claims, 14 Drawing Figures

FIG. 12
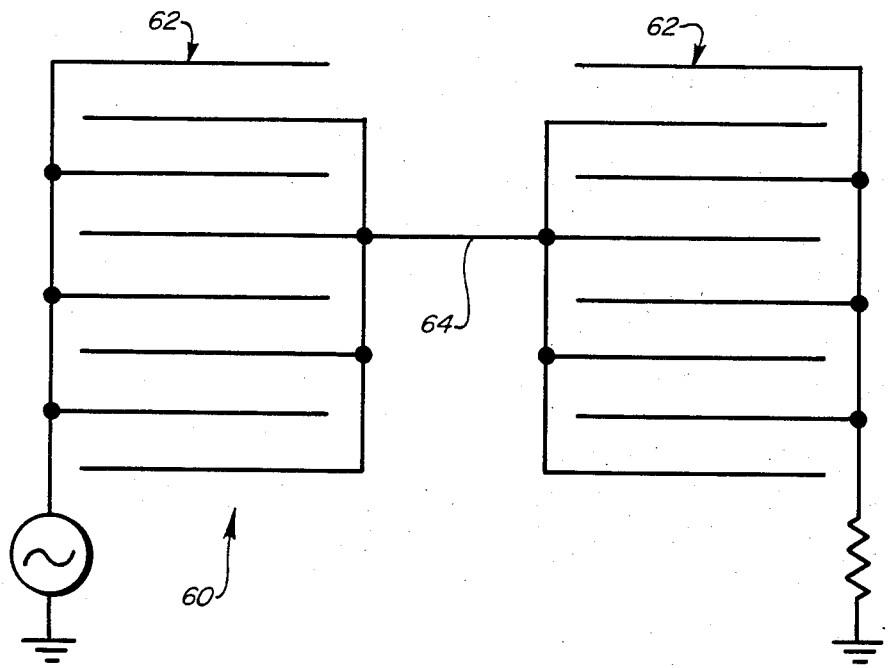
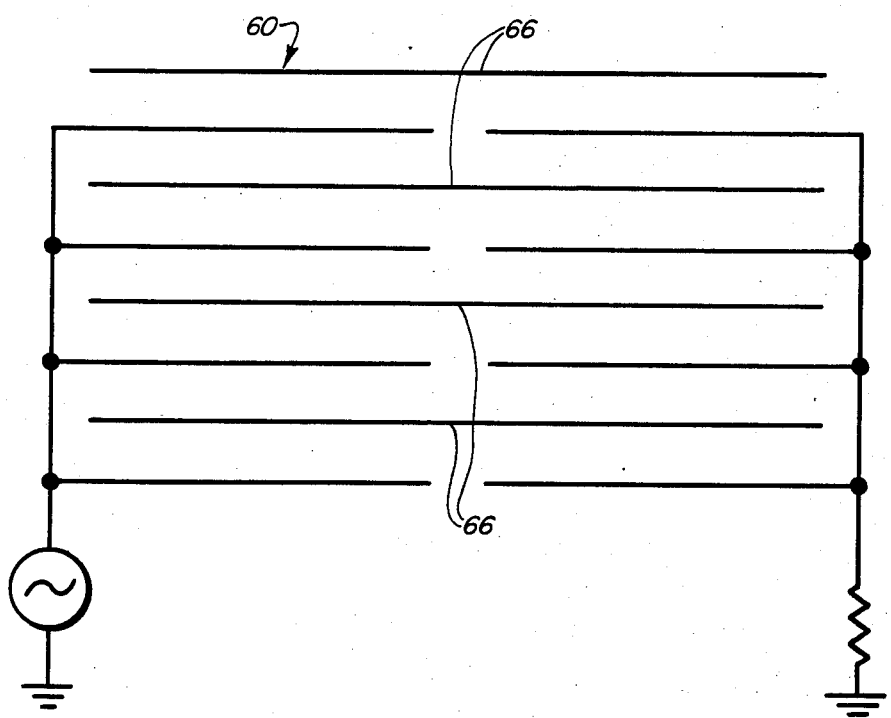
FIG. 13

RESONATOR COMPRISING A COIL FORMED OF MULTIPLE LAYER ALTERNATELY ARRANGED CONDUCTIVE TURNS

BACKGROUND OF THE INVENTION

The present invention relates generally to resonators, and more particularly to multiple conductor resonators exhibiting high Q, or quality factor.

One prior type of multiple conductor resonator is disclosed in Doty, Jr. U.S. Pat. No. 4,255,728. This type of resonator includes first and second conductors which are wound in helical fashion with the convolutions of one of the conductors being disposed between the convolutions of the other conductors to form a series of alternating first and second conductor turns. Each of the conductors includes first and second ends with the first and second ends of the first conductor comprising the terminals of the resonator and the first end of the second conductor being connected to the second end of the first conductor.

It has been found that the Q, or quality factor representing the efficiency of this type of resonator is adversely affected by the undesirable distributed capacitive coupling between a single turn of one conductor and another turn or convolution of that same conductor or the other conductor. This undesired capacitance, as well as other similar undesired capacitances hereinafter denoted "undesirable capacitance" or "undesirable capacitive coupling" is a high loss capacitance which reduces the efficiency or Q of the resonator.

Furthermore, when the resonator is operated at relatively high frequencies, the resonator exhibits skin effect which increases the ohmic resistance, and hence further decreases the Q of the resonator.

One way to decrease the undesirable interturn capacity is to substantially increase the pitch of the helical convolutions of the conductors to interpose gaps between turns of the conductors. By increasing the distance between turns, undesirable capacitance is lessened. However, this technique undesirably increases the size and weight of the resulting resonator.

SUMMARY OF THE INVENTION

In accordance with the present invention, a first embodiment of a multiple conductor resonator includes a first plurality comprising at least five spaced apart conductors disposed in at least three layers with two conductors each in a first and a third layer and a single conductor in a second layer between the first and third layers. A second plurality of at least four spaced apart conductors is utilized with each conductor of the second plurality being disposed in the spaces between conductors of the first plurality such that the single conductor of the first plurality in the second layer is surrounded on four sides by the conductors of the second plurality. The conductors of the first plurality may be connected together at a first end thereof to form a first terminal of the device, while the conductors of the second plurality may be connected together at a second end opposite the first end to form a second terminal of the device.

In a second embodiment of the invention, first and second pluralities of conductors are formed into a coil having a series of turns with the turns being closely spaced together so that a conductor of one of the pluralities is surrounded by conductors of the second plurality.

In a third embodiment of the invention, first and second pluralities of conductors are formed into a coil having a plurality of turns with gaps interposed between the turns to minimize losses associated with undesirable capacitance.

In either of the second or third embodiments, the first and second pluralities of conductors may alternatively be wound in spiral fashion in a radial direction. A plurality of such spirals may be placed side-by-side to form a multi-layered coil.

In any of the above embodiments, each conductor of one plurality is surrounded at least partially by conductors of the other plurality. A shielding effect is thereby provided for the conductors which reduces the various undesirable capacitances and increases the Q of the circuit. This decrease in undesirable capacitance also allows the resonator to be designed to operate efficiently over a wide range of frequencies.

By utilizing a plurality of conductors in place of just two, each conductor carries a proportionately smaller current. This, in turn, reduces ohmic losses resulting from skin effect.

In a further embodiment of the invention, first and second pluralities of conductors are arranged in a bundle and individual conductors occupy changing positions relative to a bundle axis along the length of the bundle so that all of the conductors are equally shielded through the length of the bundle. This arrangement also reduces the ratio of undesirable high loss capacitance to desirable capacitance between different conductors and results in an increase in Q of the resonator.

Two resonators may be serially connected and may have common magnetic and/or electric fields due to proximity of the two resonators so that design parameters can be adjusted to achieve the desired resonator characteristics.

BRIEF DESCRIPTION OF THE DRAWINGS

FIGS. 12 and 13 are schematic diagrams of further embodiments of the invention.

DESCRIPTION OF THE PREFERRED EMBODIMENTS

Figure 1:
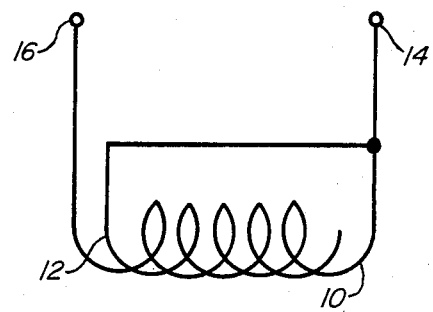
FIG. 1 is a schematic diagram of a prior art multiple conductor coil-type resonator.

Referring now to FIG. 1, there is shown a prior art multiple conductor coil-type resonator which is disclosed in Doty, Jr. U.S. Pat. No. 4,255,728. This device includes first and second conductors 10 and 12 which are wound into a plurality of convolutions or turns. The two opposite ends of the two conductors 10 and 12 are connected together to form a first terminal 14 of the device. One end 16 of the first conductor 10 forms a second terminal for the device. The other end of the conductor 12 is left unconnected.

Figure 2:
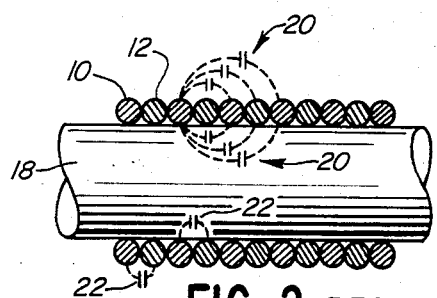
FIG. 2 is an elevational view, partly in section, of the prior art coil-type resonator shown in FIG. 1.

FIG. 2 illustrates the resonator shown in FIG. 1 as wound on a coil form 18. The turns of the resonator each comprise a turn or convolution of the first conductor 10 and the second conductor 12, with the turns of the resonator being disposed close to one another to form a series of alternating first and second conductor turns. The device shown in FIGS. 1 and 2 exhibits an equivalent distributed capacitance resulting from the combined effects of various interturn capacitances, illustrated generally by the capacitors 20 between turns of the conductors in different turns of the resonator, and the desirable capacitance between different conductors of the same turn of the resonator, illustrated by the capacitors 22. In general, it has been found that interturn capacitance reduces the overall Q of the resonator and limits the range of frequencies at which prior devices can be designed to efficiently operate.

Figure 3:
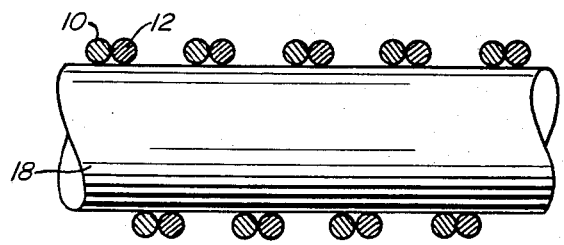
FIG. 3 is an elevational view, partly in section, of a further prior art coil-type resonator.

One prior art attempt to reduce interturn capacitance is shown in FIG. 3 wherein the pitch of the helical convolutions of the conductors is increased to provide a gap between adjacent turns of the resonator while the spacing between the two conductors is maintained. The increased spacing between adjacent turns of the resonator reduces the undesirable high loss capacitance between these turns. However, the length of the coil from 18 and the length of the conductors must be increased to accommodate the extra spacing between turns in order to achieve the same inductive reactance as the coil shown in FIG. 2. This results in an undesirable increase in size and weight of the coil.

Figure 5:
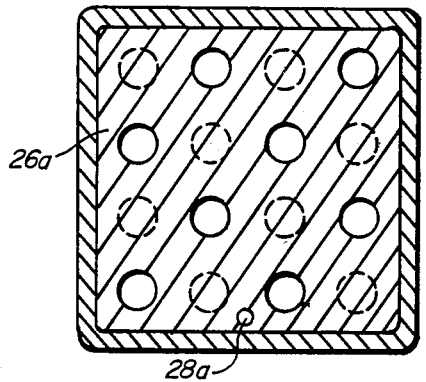
FIGS. 5 and 6 are sectional views taken along the lines 5—5 and 6—6 of FIG. 4, respectively.
Figure 6:
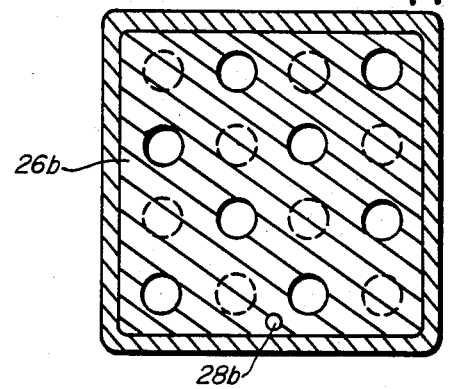
Figure 4:
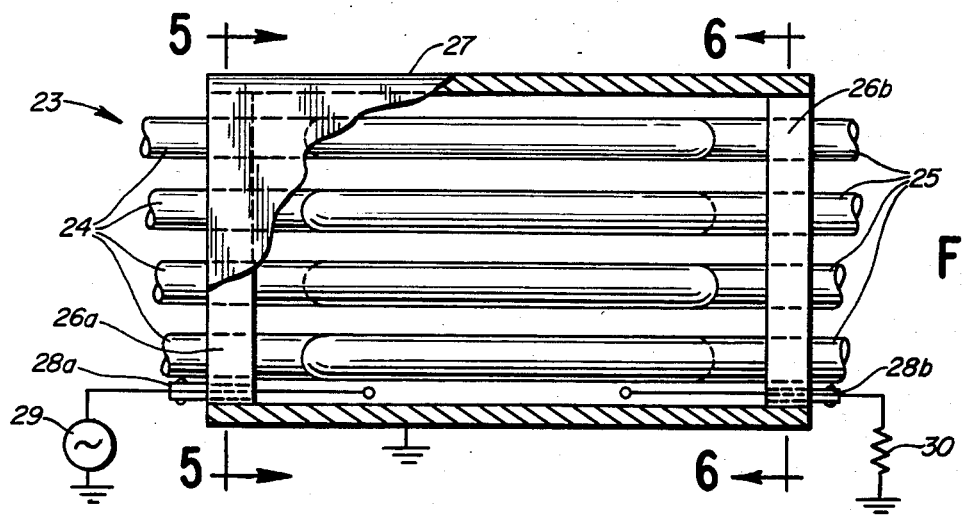
FIG. 4 is an elevational view, partly in section, of a first embodiment of a multiple conductor resonator according to the present invention.

Referring now to FIGS. 4-6, there is illustrated a first embodiment of a resonator 23 according to the present invention. The resonator 23 includes a first plurality of conductors, such as copper rods or wires 24 and a second plurality of conductors 25. In the embodiment illustrated, there are eight conductors in each of the first and second pluralities, with the conductors of each plurality being equally spaced into rows and columns. The first and second pluralities of conductors extend through and are supported by conductive end plates 26a, 26b, respectively, and a conductive cylindrical case 27 into which the end plates 26a, 26b, are fitted, thus forming a shield or screen for the resonator. The conductors of each plurality extend through the respective end plate 26a or 26b and terminate at a point short of the other end plate. The conductors are all shown as being parallel to one another, however this need not be the case.

In the illustrated embodiment, the conductors of each plurality are electrically connected together by the end plates 26a, 26b at one end thereof. The spacing between the conductors within the copper shield comprising the end plates 26a, 26b, may be maintained by means of spacers or like apparatus, as desired. The length of each conductor may be separately adjusted independently of the length of the other conductors to insure that each conductor carries a level of current approximately equal to the level of current carried by the other conductors.

It should be noted that the resonator shown in FIGS. 4-6 may include a non-conductive cylindrical case or need not include the cylindrical case, if desired. Further, the end plates 26 need not be conductive, but may be an insulative sleeve or disk which maintains the spacing between the conductors. Connections between conductors of each plurality may be made without all of the conductors of a plurality being connected together.

Each conductor of each plurality is disposed adjacent one or more conductors of the other plurality. This arrangement gives rise to a shielding effect which is discussed in greater detail below.

Although the resonator shown in FIGS. 4-6 includes four layers and four rows, it should be noted that it may alternatively contain three layers and three rows, with two conductors of the first plurality disposed in first and third layers while a single conductor of the first plurality is disposed in the second layer between the first and third layers. Four conductors of the second plurality are disposed in the spaces between conductors of the first plurality to provide a shielding effect which is most pronounced for the center or single conductor of the first plurality in the second layer.

The resonator shown in FIGS. 4-6 includes coaxial connectors 28a, 28b for capacitively coupling the resonator between a source of alternating current 29 and a load 30. The cylindrical case 27 is electrically connected to the end plates 26. The case 27 may be grounded, if desired.

As previously noted and as seen in FIGS. 5 and 6, each conductor of one of the pluralities of conductors is at least partly surrounded by conductors of the other plurality, thereby resulting in a shielding effect which reduces the undesirable capacitive coupling between any single conductor and other conductors of the same plurality, the undesirable coupling between any single conductor and the case or the undesirable coupling between points on the same conductor. This in turn results in an increase in quality factor or Q of the resonator.

Figure 7:
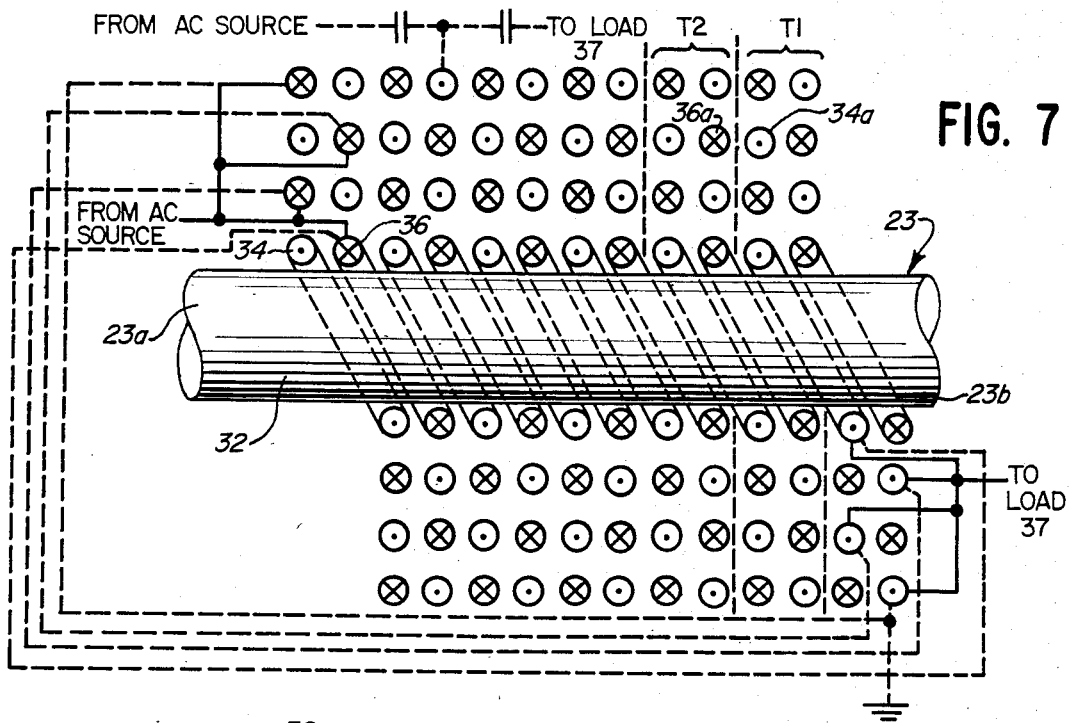
FIG. 7 is an elevational view, partly in section, of a second embodiment of a multiple conductor resonator according to the present invention.

Referring now to FIG. 7, there is illustrated a further embodiment of the resonator 23 according to the present invention. Two conductors 34 and 36 are wound in helical fashion about a coil form 32 to form a first layer comprising alternating first and second conductor turns. Additional second through fourth layers each having alternating first and second conductor turns are wound atop the first layer. A first plurality of turns marked with an "X" are each connected together to an AC source 35 at one end 23a of the coil 23 while a second plurality of turns marked with a dot are connected together to a load 37 at the other end 23b of the coil 23. These connections are made to form a series resonant circuit. Each turn marked with an "X" is adjacent to turns marked with a dot, and vice versa. The turns of the coil are closely packed together (i.e. "close-wound") as compared with prior devices so that the space between conductors is small compared to the cross-sectional size of the wire. The conductors are insulated from one another by suitable means.

The embodiment of FIG. 7 may be described alternatively as follows. A first conductor 34 and a second conductor 36 are wound into a coil having turns disposed in side-by-side relationship to form a first layer of alternating first and second conductor turns. Third and fourth conductors 80, 82 are wound on top of the first layer into a coil to form a second layer wherein a turn of the third conductor overlies a turn of the second conductor 36 and a turn of the fourth conductor 82 overlies a turn of the first conductor 34. Fifth and sixth conductors 84, 86 are wound into a coil atop the second layer to form a third layer wherein a turn of the fifth conductor 84 overlies a turn of the fourth conductor 82 and a turn of the sixth conductor 86 overlies a turn of the third conductor 80. Similarly, seventh and eight conductors 88, 90 are wound atop the third layer to form a fourth layer wherein a turn of the seventh conductor 88 overlies a turn of the sixth conductor 86 and a turn of the eighth conductor 90 overlies a turn of the fifth conductor 84. As shown by the solid lines of FIG. 7, the first, third, fifth and seventh conductors are connected together at the end 23b of the coil to form a first terminal while the second, fourth, sixth and eighth conductors are connected together at the other end 23a of the coil to form a second terminal of the device.

Alternatively, as shown by the dotted lines in FIG. 7, one end of the first conductor may be connected to the other end of the second conductor, the third conductor similarly connected to the fourth conductor, the fifth conductor similarly connected to the sixth conductor and the seventh conductor similarly connected to the eighth conductor. A common or ground connection may be made at the point connected to the load 37 in the previous embodiment. In such a case, the connections to the source and load may be accomplished at one or more points on one or more conductors where there is a voltage difference with reference to ground. These connections may be accomplished by capacitive coupling, or the like, as shown by the dotted lines.

Again, the coil may include only three layers, in which case only first through sixth conductors would be utilized as noted above.

Figures 8A, 8B:
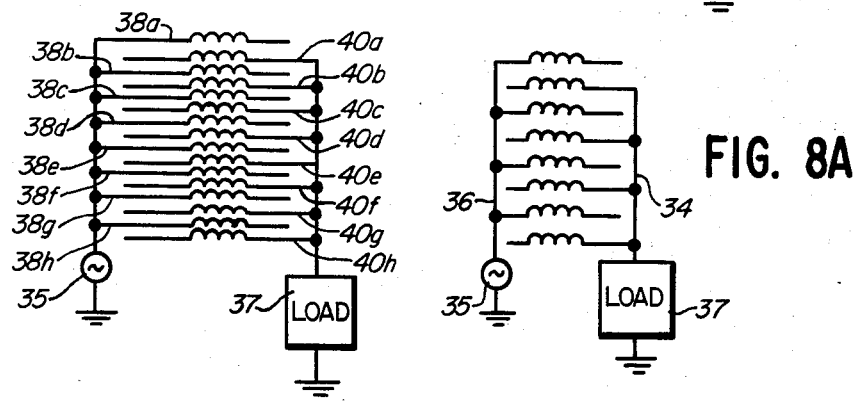
FIGS. 8A and 8B are schematic diagrams showing the connection of the resonators shown in FIGS. 7 and 9, respectively, to a source of alternating potential and a load.

Referring also to FIG. 8A, the resonator may be connected as a series-resonant circuit between the AC source 35 and the load 37.

For a parallel resonant configuration, the first, third, fifth and seventh conductor ends may be connected to the second, fourth, sixth and eighth conductor ends.

In general, for resonant operation, the resonator includes at least one circuit loop formed by the connection of two conductors having turns which are vertically or horizontally adjacent.

As seen in FIG. 7, each interior turn of one of the pluralities of conductors such as the conductor turn 34a in a particular turn T1 of the coil 23 is surrounded on four sides by turns of the other plurality of conductors. Three of these turns of the other plurality of conductors are in the same coil turn T1 as the turn 34a while the fourth conductor turn, designated 36a, is in an adjacent turn T2 of the resonator 23. The capacitive coupling between the turns 34a and 36a includes a certain amount of undesirable capacitive coupling. However this desirable and undesirable capacitance between opposite conductors in adjacent turns of the resonator is less objectionable than the undesirable capacitance between turns of the same conductor. This resonator configuration results in each interior turn experiencing the previously noted shielding effect which is somewhat less than the shielding effect experienced by the conductors in the previous embodiment due to the coupling between opposite conductors in adjacent turns of the resonator. The shielding effect reduces the undesirable capacitive coupling between any conductor turn and any other turn of the same plurality. Coupling between conductors of the opposite electric polarity in the same turn of the coil is unaffected and hence the ratio of desirable capacitance to undesirable capacitance increases. This in turn results in an increase in the quality factor or Q of the resonator.

The above-noted shielding effect is less pronounced for conductors lying adjacent the ends or on the inner and outer diameters of the coil.

Figure 9:
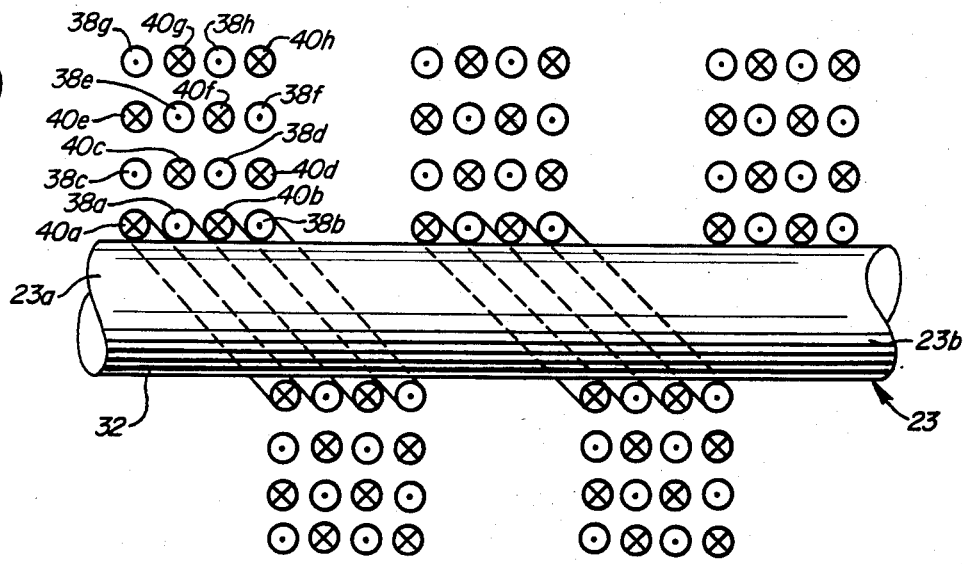
FIG. 9 is a view similar to FIG. 7 of a third embodiment of the invention.

Referring to FIGS. 8B and 9, there is illustrated a further embodiment of the invention wherein the two conductors 34,36 are replaced by two sets of conductors 38a–38h and 40a–40h. The conductors 38a–38h connected together at one end 23a of the coil 23 and to the source of alternating potential 35. The conductors 40a–40h are connected together at the other end 23b and to the load 37. As seen in FIG. 9, the conductors 38a–38h,40a–40h may be grouped together as a bundle of conductors, with the bundle being formed on the coil form 32 such that a gap is interposed between adjacent turns of the bundle. Two of the conductors 38a,38b are disposed in the first layer closest to the coil form 32 alternating with conductors 40a,40b. A second layer atop the first layer includes the conductors (seen from left to right in FIG. 6) 38c, 38d,40c,40d. Similarly, a third layer comprises the conductors 38e,40e,38f,40f while a fourth layer comprises the conductors 40g, 38g,40h,38h.

This embodiment is in essence the first embodiment discussed above formed into a series of loops which together comprise a coil. This coil winding increases inductive reactance, thereby decreasing the resonant frequency of the device.

The conductors may be connected together to form terminals similar to the embodiment shown in FIG. 7.

In the embodiment of FIG. 9, the conductors 40c,38d,38e, 40f are completely surrounded on four sides by turns of the opposite set of conductors, thereby resulting in the above-noted shielding effect which increases the Q of the circuit over prior devices. Also, ohmic losses are reduced as compared with the circuit shown in FIG. 8A since each single conductor in a layer having a resistance R is replaced by a plurality of parallel conductors in a layer having a combined resistance less than R.

While this embodiment requires a larger coil form 32 and longer conductors to accommodate the extra spacing between turns of the bundle, the coil 23 is still smaller in size than the prior art coils shown in FIGS. 1–3 for a given Q.

The embodiment of FIG. 9 may alternatively be constructed without the gaps, resulting in a closewound coil similar to the embodiment shown in FIG. 7. In this case, not only is the resulting coil smaller than the coil in FIG. 9, but the coil also contains a greater number of conductors which experience a more complete shielding effect. This coil can be designed to resonate more efficiently than prior coils, and may be designed to operate over a wider range of frequencies.

It should be noted that the number of layers and conductors of the coil 23 may be varied to obtain the desired capacitive and inductive reactances. However, the coil should contain a minimum of three layers so that at least one of the layers, i.e. the layer intermediate the inside and outside layers, contains conductors which experience the above-noted shielding effect.

Figure 10:
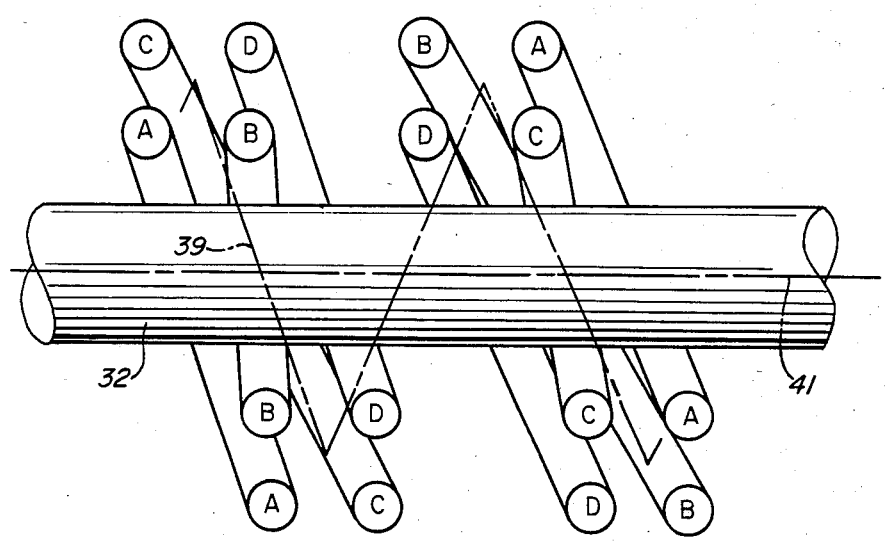
FIGS. 10 and 11 are elevational views similar to FIG. 7 showing further embodiments of the invention.

Referring now to FIG. 10, there is illustrated a further embodiment of the invention wherein the positions of conductors or bundles of conductors along the length of the bundle vary relative either to the axis 41 of the coil or to the axis of the bundle to equalize the shielding effect on each conductor. The coil includes four conductors or bundles of conductors A-D which are formed in helical fashion about the coil form 32. In the illustrated embodiment, the conductors or bundles of conductors A-D are transposed in the form of a clockwise twist of one-half revolution (as seen in FIG. 10) about a helical bundle axis 39 for each loop or turn of the conductors about the coil form 32. The term "bundle axis" means the helical line defining the center of the combined elements A-D.

In the event that each of the elements A-D is a bundle of conductors, such bundle comprises two or more conductors which are located relative to one another such that a series of alternating first and second conductors are formed having any number of layers. For example, each bundle may be identical to the bundle shown in FIG. 9 which comprises eight first conductors 38 and eight second conductors 40.

Each loop or turn of the combined elements A-D may lie next to adjacent loops or turns to form a closewound coil, or loops may be spaced from adjacent loops similar to the embodiment shown in FIG. 9. In either case, the configuration of the coil shown in FIG. 10 results in an approximately equal shielding of each of the conductors contained therein, thereby leading to an increase in the quality factor Q over prior art devices.

Figure 11:
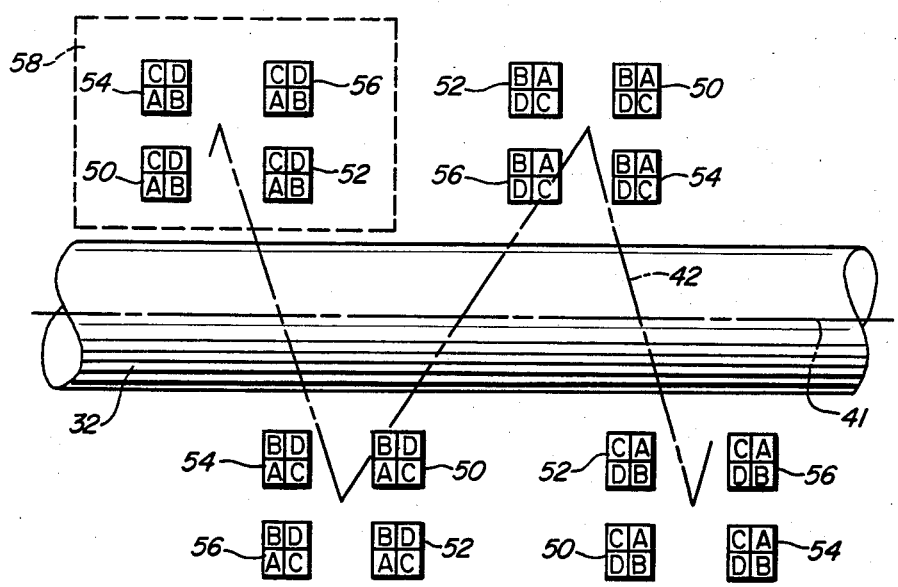

Referring now to FIG. 11, there is illustrated an embodiment wherein four sets 50,52,54,56 of the conductors or bundle of conductors A-D shown in FIG. 10 are wound together about the coil form 32 wherein the sets occupy varying positions relative to the coil axis 41 along the length of the bundle. Each of the elements 50,52,54,56 includes the conductors or bundles of conductors A-D (which themselves occupy varying positions relative to the axis 41), and the combined elements 50,52,54,56 comprise a main bundle 58. The main bundle 58 is wound about the coil form 32 such that adjacent turns thereof are packed closely together to form a closewound coil or have gaps therebetween. Further, the elements 50,52,54,56 are transposed by being twisted counterclockwise (as seen in FIG. 11) one-half turn about a main bundle axis 42 for each full turn of the main bundle 58 about the coil form 32. Twists may be formed at discrete points on the bundle of conductors, or they may be continuously formed along the conductor lengths.

The embodiment of FIG. 11 results in a more nearly equal shielding effect for each of the conductors disposed therein than the coil shown in FIG. 10. Accordingly, a higher Q can be achieved than for the coil shown in FIG. 10.

It should be noted that the embodiments illustrated in FIGS. 10 and 11 may include a different number of conductors or bundles, as desired. Also, either of these embodiments may be connected to a source of alternating potential and to a load, one example being shown in FIG. 8B where one half of the conductors are connected to the source and the other half of the conductors are connected to the load with turns of the first half being partially or completely surrounded by turns of the second half.

In any of the embodiments, conductors which are square or rectangular in cross-section may be utilized in place of the circular cross-section conductors shown in the figures. The use of square or rectangular conductors would result in lower losses since substantially all of the capacitive coupling between such conductors occurs between the flat face thereof. If the flat faces of one conductor of one plurality of conductors is aligned parallel to the flat faces of adjacent conductors of the other plurality, desirable capacitive coupling is enhanced while undesirable capacitive coupling is minimized.

Furthermore, a variable spacing of turns, variable conductor geometry, or variable bundle geometry may be employed to maintain a more nearly constant inductive reactance per unit length of conductor to improve efficiency.

Referring now to FIG. 12, there is illustrated a resonator 60 which comprises two series-connected resonator portions 62. The resonator portions 62 together are of a size equivalent to the resonator shown in FIG. 9, however, the capacitance of the resonator 60 shown in FIG. 12 is only one-fourth the capacitance of the resonator shown in FIG. 9 and the resonant frequency is approximately twice as great. This is due to the fact that the resonator 60 of FIG. 12 is in effect the resonator of FIG. 9 divided in half and then joined serially as two resonators, thereby placing in series two capacitors each having one-half the capacitance of the resonator of FIG. 9. This resonator construction allows adjustment of the LC ratio of the resonant circuit, since the capacitance of the resonator is decreased with no change in inductance.

The embodiment of FIG. 12 may alternatively be understood by envisioning two of the resonators shown in FIG. 9 as being series-connected and comparing the electrical characteristics of the resulting resonator with a resonator similar to that shown in FIG. 9 but with twice the number of turns. In such a case, the series connected resonator would have a capacitance one-fourth that of the resonator having twice the number of turns as that shown in FIG. 9. The inductance of the series-connected resonator and the resonator that has twice the number of turns as that shown in FIG. 9 would be approximately equal, however.

Referring also to FIG. 13, the resonator 60 may alternatively be constructed without the common connection 64 shown in FIG. 12. The common connection 64 is instead replaced by discrete conductors 66, each of which is independent of the other conductors 66, i.e. there is no physical connection between any one conductor 66 and any of the other conductors 66. The resonator 60 shown in FIG. 13 is in all respects equivalent electrically to that shown in FIG. 12; however, the resonator shown in FIG. 13 is simpler to construct and eliminates the necessity for soldered connections between the conductors 66.

Efficiency in any of the above embodiments can be further increased by varying the capacitance between conductors as a function of inductance to thereby maintain equal current division between conductors. The capacitance can be varied by varying the spacing between conductors and/or by varying the dielectric constant of the material between conductors.

It should be noted that each of the embodiments noted herein need not be used at resonance, but instead may be used as a loading coil, antenna trap or any other filter element, as desired.

I claim:
1. A resonator, comprising:
   a first plurality of five spaced-apart conductors disposed in three layers and three rows wherein first and second pairs of conductors are disposed in a first and a third layer, respectively, and a single conductor is disposed in a second layer between the first and third layers and wherein one conductor of each of the first and second pairs is disposed in a first row, the other conductor of each pair is disposed in a third row and the single conductor is disposed in a second row between the first and third rows; and a second plurality of four spaced-apart conductors separate from and interspaced between the conductors of the first plurality, a first conductor of the second plurality being disposed in the first layer and the second row between the conductors of the first pair, a second conductor of the second plurality being disposed in the third layer and the second row between the conductors of the second pair and third and fourth conductors of the second plurality being disposed in the second layer, first row and the second layer, third row, respectively.

2. The resonator of claim 1, wherein the conductors form at least one loop.

3. The resonator of claim 1, wherein the conductors form at least two loops wherein all of the loops are spaced from one another.

4. The resonator of claim 2, wherein the conductors have a certain cross-sectional size and at least two loops are disposed adjacent to one another so that the space between conductors is small compared to the cross-sectional size of the conductors.

5. A resonator, comprising:
first and second conductors formed into a coil and having turns disposed in side-by-side relationship to form a first layer of alternating first and second conductor turns;
third and fourth conductors formed into a coil and having turns atop the first layer to form a second layer wherein a turn of the third conductor overlies a turn of the second conductor and a turn of the fourth conductor overlies a turn of the first conductor;
fifth and sixth conductors formed into a coil and having turns atop the second layer to form a third layer wherein a turn of the fifth conductor overlies a turn of the fourth conductor and a turn of the sixth conductor overlies a turn of the third conductor; and
means for connecting separate conductors together in parallel to form a plurality of terminals.

6. The resonator of claim 5, wherein the connecting means includes means for connecting the first, third and fifth conductors together to form a first terminal and means for connecting the second, fourth and sixth conductors together to form a second terminal.

7. The resonator of claim 5, wherein the connecting means includes means for connecting the first conductor to the second conductor, the third conductor to the fourth conductor and the fifth conductor to the sixth conductor.

8. The resonator of claim 5, wherein the conductors have a certain cross-sectional size and the turns of the conductors are disposed adjacent to one another so that the space between conductors is small compared to the cross-sectional size of the conductors.

9. A resonator, comprising:
a bundle of conductors including first and second sets of conductors, each set having at least two conductors, the conductors of the first set being disposed in side-by-side relationship with the conductors of the second set and the conductors of the sets being arranged in multiple layers whereby each layer comprises an alternating series of conductors of the first and second sets and each conductor of the first set in one layer is in alignment with conductors of the second set in adjacent layers in a direction perpendicular to the layers.

10. The resonator of claim 9, wherein each conductor of the first set is uniformly spaced from adjacent conductors of the second set.

11. The resonator of claim 9, wherein the bundle of conductors includes a plurality of loops spaced from one another by gaps.

12. The resonator of claim 9, wherein the bundle of conductors are arranged such that they define a bundle axis at the center of the bundle and a plurality of bundle loops with the conductors being twisted so that the conductors of the bundle occupy differing positions relative to the bundle axis.

13. The resonator of claim 9, further including a plurality of additional bundles of additional conductors, each additional bundle of conductors including first and second sets of conductors, each set having at least two conductors and each bundle being arranged such that it defines a bundle axis and being arranged in a plurality of loops, the conductors of each bundle being twisted with one another and all of the bundles being twisted with one another along the length of the bundles of conductors.

14. The resonator of claim 9, further including a plurality of additional bundles of additional conductors, each additional bundle of conductors including first and second sets of conductors, each set having at least two conductors and each bundle being arranged such that it defines a bundle axis, the conductors of each bundle being twisted with one another and all of the bundles being twisted with one another along the length of the bundles of conductors.

15. The resonator of claim 11, wherein the loops are disposed in concentric fashion to form a helix.

16. The resonator of claim 11, wherein the loops are disposed in radial fashion to form a spiral.

* * * * *